United States Patent [19]

Cripps

[11] Patent Number: 5,027,064
[45] Date of Patent: Jun. 25, 1991

[54] METHOD AND MEANS FOR MEASURING OPERATING TEMPERATURE OF SEMICONDUCTOR DEVICES BY MONITORING RF CHARACTERISTICS

[75] Inventor: Stephen C. Cripps, Sunnyvale, Calif.

[73] Assignee: Celeritek, Inc., San Jose, Calif.

[21] Appl. No.: 340,611

[22] Filed: Apr. 19, 1989

[51] Int. Cl.⁵ .............................................. G01R 31/26
[52] U.S. Cl. .............................. 324/158 T; 324/71.5; 324/158 D
[58] Field of Search ........... 324/158 D, 158 T, 158 R, 324/72.5, 71.5; 374/100, 178

[56] References Cited

U.S. PATENT DOCUMENTS

| | | | |
|---|---|---|---|
| 3,659,199 | 4/1972 | Knutson | 324/158 D |
| 3,870,953 | 3/1975 | Boatman | 324/72.5 |
| 3,895,297 | 7/1975 | Jarl | 324/158 T |
| 3,904,962 | 9/1975 | Olson, Jr. | 324/158 D |
| 4,114,096 | 9/1978 | Chinery | 324/158 D |
| 4,588,945 | 5/1986 | Groves et al. | 324/158 R |

Primary Examiner—Ernest F. Karlsen
Attorney, Agent, or Firm—Flehr, Hohbach, Test, Albritton & Herbert

[57] ABSTRACT

The operating temperature of the active region of an RF semiconductor device such as a microwave hybrid circuit having a gallium arsenide field-effect transistor therein is determined by measuring signal gain of the device at variable times following application of bias voltage to the device. Bias voltage is applied in response to a constant duty cycle pulse train from which are derived a sample-and-hold command pulse and a synchronized bias control pulse.

22 Claims, 3 Drawing Sheets

METHOD AND MEANS FOR MEASURING OPERATING TEMPERATURE OF SEMICONDUCTOR DEVICES BY MONITORING RF CHARACTERISTICS

BACKGROUND OF THE INVENTION

This invention relates generally to semiconductor integrated circuit test apparatus, and more particularly the invention relates to a method and apparatus for measuring operating temperature of the active area of a semiconductor device.

The operating temperature of semiconductor devices, particularly gallium arsenide FETs employed in microwave circuits, is an important parameter in military and space applications. The operating temperature of the active area directly relates to the operating lifetime of the device.

However, semiconductor die are too small to use conventional contact probing techniques to measure their temperature. Three alternative techniques are presently used and are the basis for several commercially available products.

In one technique, a high-magnification microscope is used in conjunction with an infrared detector. The intensity of the infrared radiation from the focused area is a strong function of temperature and can, in principle, be detected and measured. However, different materials have widely varying emissivities which makes the accuracy of any measurement critically dependent on an in situ calibration procedure and on the precise positioning of the sample area. Accuracy and repeatability are difficult to achieve in practical use; however, high-volume manufacturing and screening applications have used the technique because of the nonintrusive nature thereof.

The optical properties of liquid crystals can be employed in monitoring temperature. However, this is essentially a destructive technique which can only be used in sample tests. The test device has to be coated with the crystals and cannot be reused in its normal application. The technique does have the advantage of very high resolution and is typically used to locate hot spots. Only one temperature can be measured per crystal type.

The electrical characteristics of the device itself can be used as a temperature-sensitive parameter. Conventionally, pulsed DC characteristics are monitored such as the forward voltage-current characteristic of the base-emitter junction of a bipolar transistor. For example, Sage Enterprises Inc. of Mountain View, Calif. manufactures thermal resistance testers which monitor the forward voltage drop of a diode junction, such as the emitter-base junction of a transistor. The selected parameter under steady-state operating conditions is compared with the same parameter shortly after power is applied and before the device has had time to heat significantly. The apparatus advantageously employs the active region being measured as the sensing element. However, in practical use, the apparatus is limited mainly to discrete, single devices in packages that give access to all of the device terminals.

The present invention is directed to an improved apparatus and technique for measurement of the operating temperature of the active region in a semiconductor device where terminals of an active component therein are not readily accessible.

SUMMARY OF THE INVENTION

An object of the present invention is an improved method of measuring the operating temperature of an active region of a semiconductor device.

Another object of the invention is test apparatus for readily implementing the measuring of operating temperature in accordance with the invention.

Still another object of the invention is greater accuracy, resolution and repeatability in the measuring of device operating temperature.

A feature of the invention is the use of RF characteristics of a device to sense temperature of the device.

Briefly, in accordance with one embodiment of the invention, the temperature of the active region of a gallium arsenide field-effect transistor used in a microwave amplifier circuit is determined. A gallium arsenide field-effect transistor has a well-defined and monotonic decrease of small signal gain versus increasing temperature. RF gain of the microwave amplifier is measured on a transient basis as the device is heated up from an ambient temperature.

Apparatus in accordance with the invention includes means for holding a device undergoing test, signal generator means for applying an input signal to the device undergoing test, and detector means for detecting an output signal from the device undergoing test in response to the input signal. Control means is provided for periodically supplying bias voltages to the device undergoing test, and sample-and-hold means responsive to the control means samples the output from the detector means at different times while a bias voltage is applied to the device undergoing test. Means then measures the sampled output for different periods after a bias voltage is applied and provides a measure of operating temperature therefrom.

Advantageously, a measurement window of a few microseconds is used to measure the RF gain of the device undergoing test with the position of the measurement window being moved from the instant bias is applied to the device undergoing test to several milliseconds after applying a bias voltage by appropriate setting of the control voltage. A typical thermal time constant may be on the order of one millisecond; therefore by observing the change in gain as the measurement window is swept from zero to 5 milliseconds, the heating of the active device area can be directly observed.

The invention and objects and features thereof will be more readily apparent from the following detailed description and appended claims when taken with the drawing.

DETAILED DESCRIPTION OF ILLUSTRATIVE EMBODIMENTS

Figure 1:
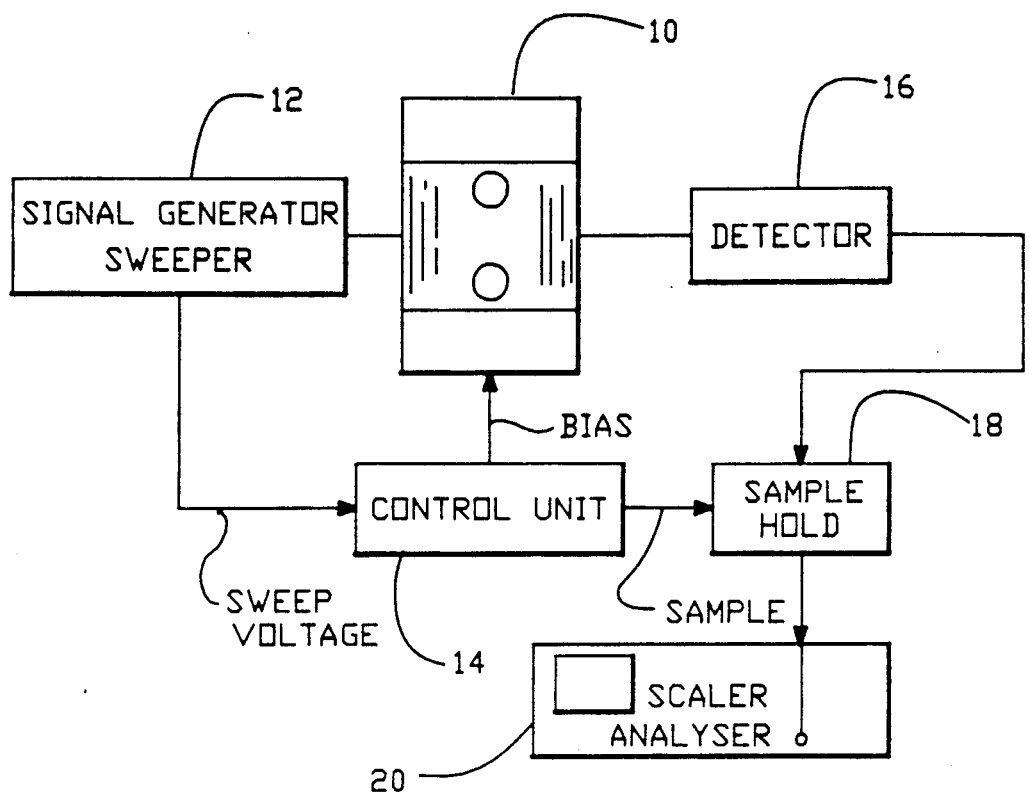
FIG. 1 is a functional block diagram of a temperature measurement apparatus in accordance with the invention.

Referring now to the drawing, FIG. 1 is a functional block diagram of apparatus in accordance with the invention. A device under test, such as a gallium arsenide field-effect transistor in a microwave amplifier circuit, for example, is mounted in a test fixture 10 which can be a conventional fixture as used in measuring RF characteristics of a microwave integrated circuit subassembly for a module. The signal generator 12 generates an input signal for application to the module in fixture 10, and the signal generator also provides a sweep voltage for a control unit 14. Control unit 14 responds to the sweep voltage from generator 12 and generates a constant duty cycle, variable width pulse, which is used to supply the bias voltage to the device under test. The pulse width can be varied over a wide, selectable range by varying the control voltage which is applied as an input to the control unit.

Detector 16 detects the output signal from the device under test, while bias voltage is applied to the device under test. A sample-and-hold unit 18 is connected to the detector and holds the detector output voltage in response to a command pulse provided by the control unit 14. With this arrangement, the RF gain of the device under test can be measured during a measurement window of a few microseconds. The position of the measurement window can be moved from the instant bias is first applied to the device under test to several milliseconds after application of the bias voltage by appropriate setting of the control voltage. A typical thermal time constant may be on the order of one millisecond; therefore by observing the change in gain as the measurement window is swept from zero to 5 milliseconds, the heating of the active device area can be directly observed.

The sample voltage from sample-and-hold unit 18 is applied to a video amplifier 20 which develops a plot of the thermal characteristics of the device under test.

Figure 2:
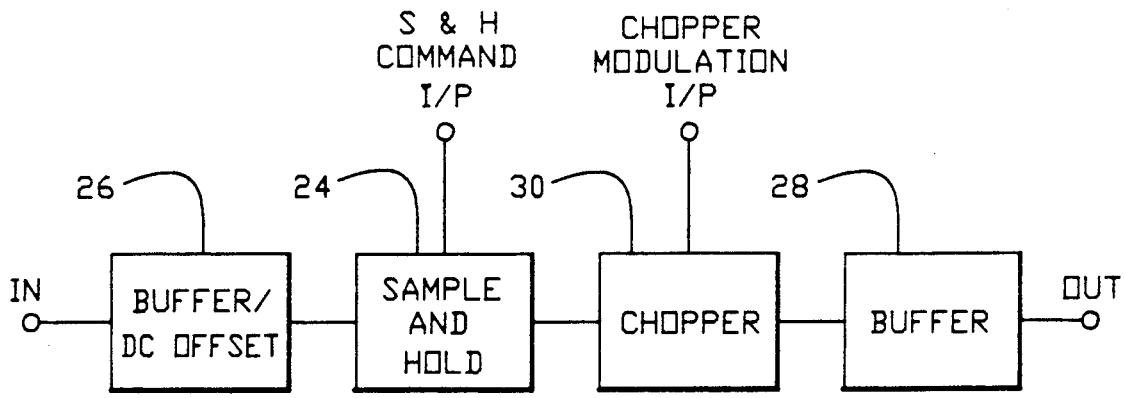
FIG. 2 is a functional block diagram of sample-and-hold circuitry in the apparatus of FIG. 1.

FIG. 2 is a functional block diagram further illustrating the sample-and-hold unit 18 of FIG. 1. A conventional sample-and-hold chip 24 has a buffered input at 26 and a buffered output 28 to maintain the necessary interface impedance levels. A chopper 30 can be connected between the sample-and-hold chip 24 and the output buffer 28. The input buffer 26 requires a DC offset since the detector will usually operate with some DC bias that must be removed prior to chopping.

Figure 3:
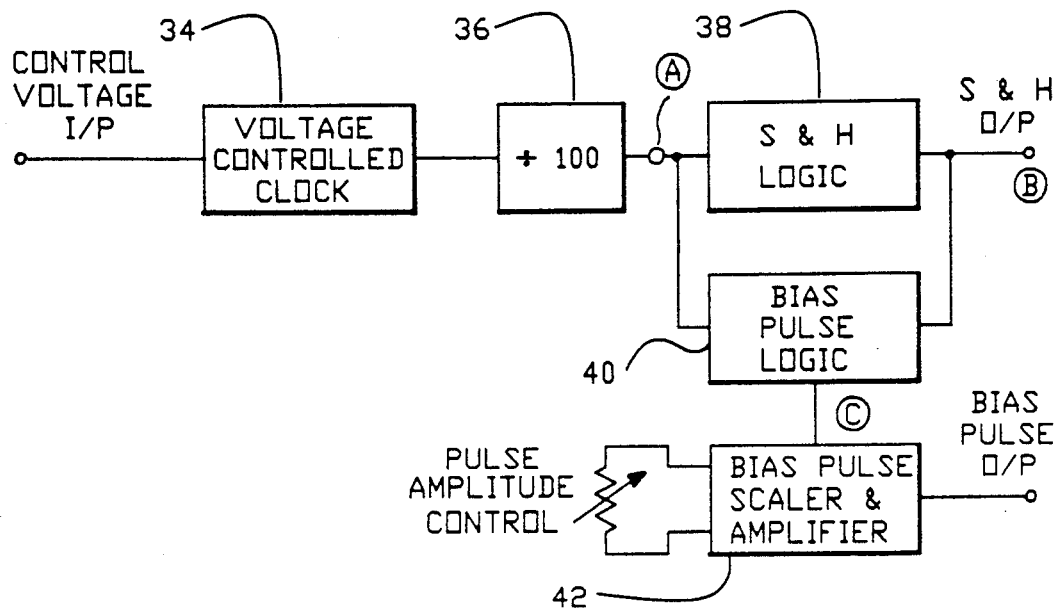
FIG. 3 is a functional block diagram of the control unit in the apparatus of FIG. 1.

FIG. 3 is a more detailed block diagram of the control unit. A voltage-controlled clock oscillator 34 receives the control voltage from signal generator 12 and has a frequency output range of 1000:1. This clock output is divided down by 100 at 36 to obtain a constant duty cycle pulse train at point A. This divided output pulse train passes through logic at 38 to provide the sample command pulse at point B. Synchronized bias pulse is obtained from logic 40. The logic signal C is amplified and scaled at 42 to provide a variable voltage bias pulse to the device under test. The sample-and-hold command pulse is synchronized with the end of the bias pulse, but switches into hold mode before the bias pulse switches off.

Figure 4:
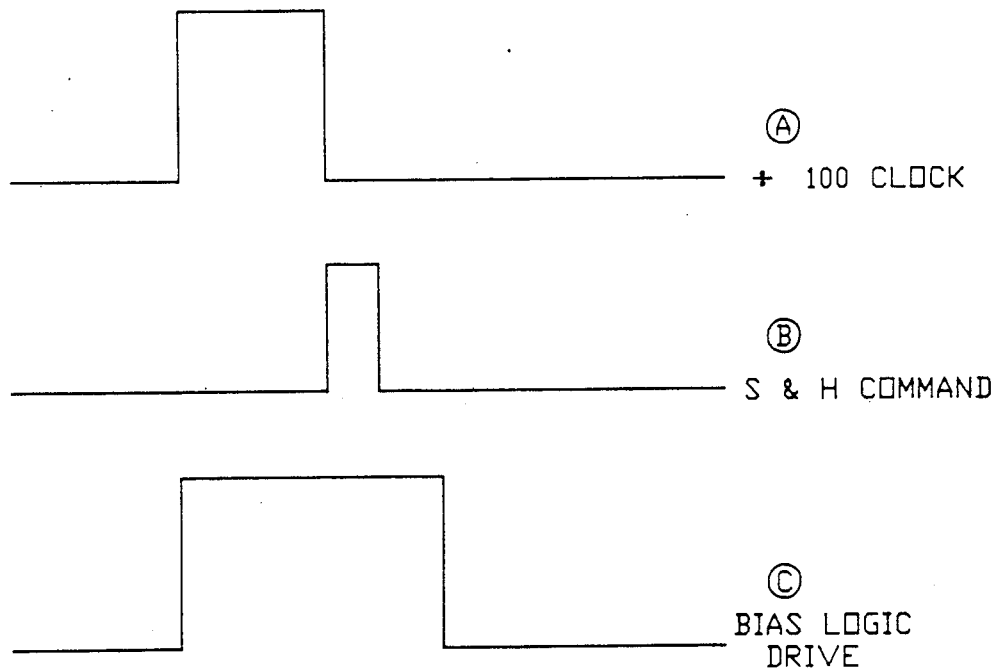
FIG. 4 is a timing diagram in the operation of the apparatus of FIG. 1.

FIG. 4 is an illustration of the timing signals at points A, B and C in the control unit block of FIG. 3. Signal A is one pulse of a constant duty cycle pulse train, signal B is the sample-and-hold pulse for the sample-and-hold command B, and pulse C is the bias pulse applied to the device under test.

Figure 5:
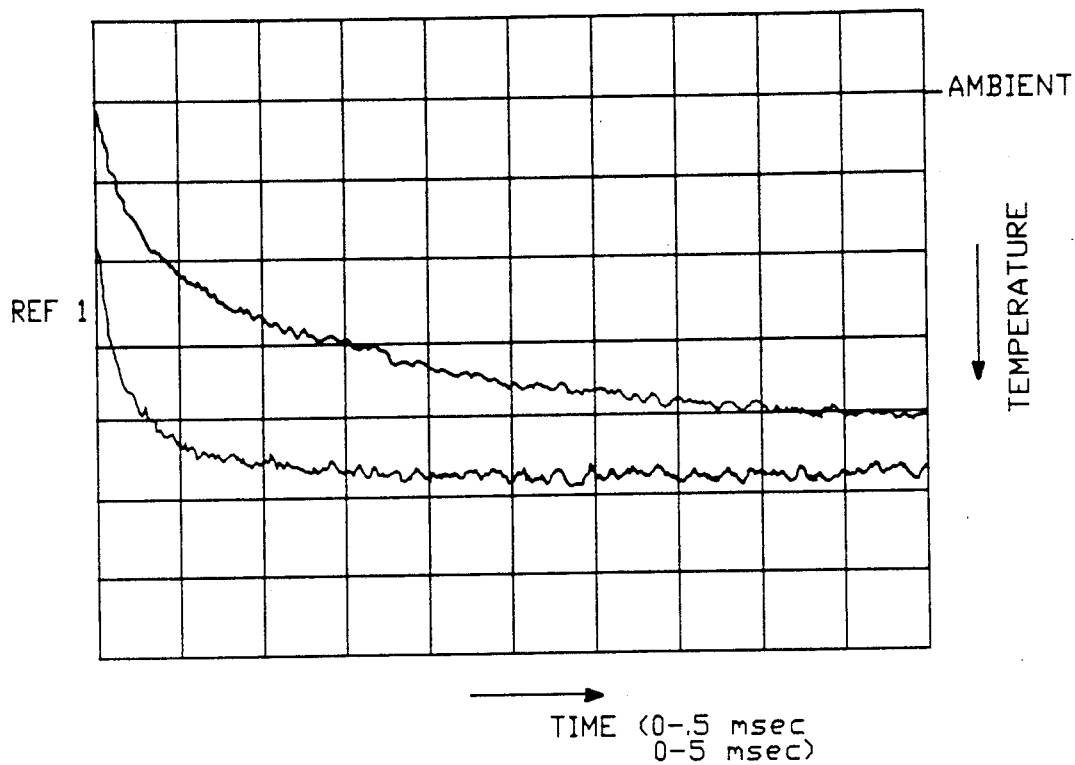
FIG. 5 is a plot illustrating the operating temperature characteristics of devices using the apparatus of FIG. 1.
Figure 6:
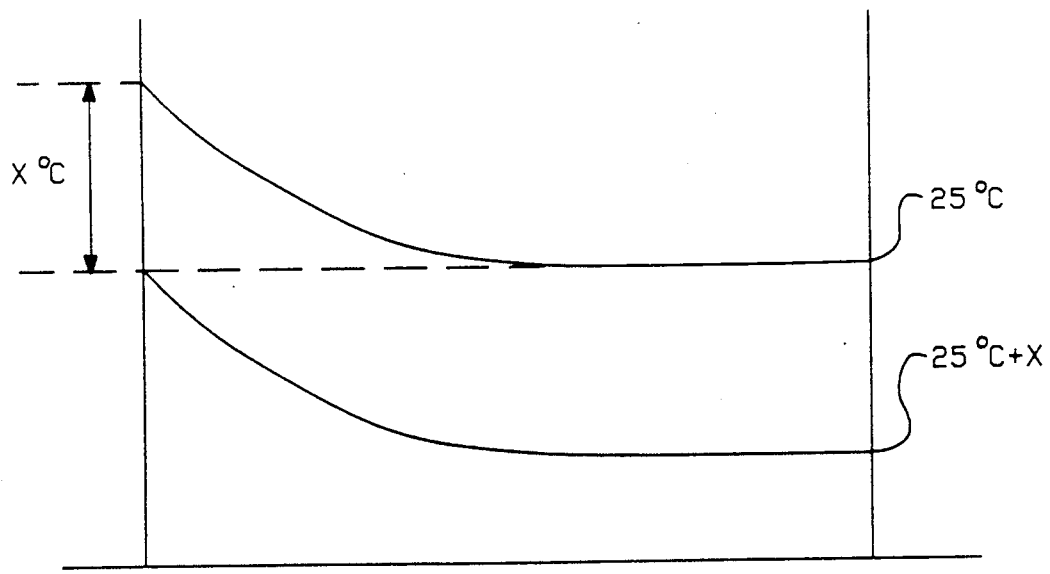
FIG. 6 is a plot illustrating the use of the apparatus of FIG. 1 with a fixture for heating the device under test and obtaining operating temperature characteristics at elevated temperatures.

Since gallium arsenide field-effect transistors have a well-defined gain-vs.-temperature characteristic which is fairly linear, a plot of the sampled output from the device under test swept through the time period of the application of the bias voltage gives a direct display of the heating of the active device area can be directly observed. A convenient way of recording the data is to use a ramp voltage to drive an x-y recorder and also provide the control voltage. A typical output plot is shown in FIG. 5. The vertical scale can be read directly in temperature if the gain conversion factor for the device under test is known. A more accurate absolute calibration can be performed if the test fixture is provided with a small heater and a temperature controller. The fixture can then be heated up until the gain at the zero time position corresponds to the desired measurement location on the thermal characteristics as illustrated in the plot of FIG. 6.

The operating temperature measuring apparatus in accordance with the invention provides greater accuracy, resolution, and repeatability than conventional test procedures. Further, the technique can be used to screen device temperature on complete assemblies since access to device terminals is not necessary. Useful comparative data can be obtained on assemblies containing a cascade of several devices. Such data would be adequate for screening out a poorly attached die, for example.

The apparatus is particularly useful in measuring relative and absolute operating temperature in the channel region of a gallium arsenide field-effect transistor mounted in a hybrid microwave integrated circuit. However, the technique and apparatus can be used with other types of semiconductor devices including silicon bipolar transistors, silicon MOS transistors, and gallium arsenide microwave integrated circuits (MMICs). Further, the apparatus can be used for measurement of RF and microwave amplifier under pulsed conditions and the characterization of RF and microwave transistors under pulsed conditions.

Thus, while the invention has been described with reference to a specific embodiment and application, the description is illustrative of the invention and is not to be construed as limiting the invention. Various modifications and applications may occur to those skilled in the art without departing from the true spirit and scope of the invention as defined by the appended claims.

I claim:

1. A method of determining operating temperature the active region in a RF semiconductor device comprising the steps of
    a) applying an RF signal to an input of a semiconductor device,
    b) applying bias voltage to the semiconductor device for limited periods of time,
    c) sampling an output signal from the semiconductor device at different times during the limited period of time, and
    d) determining operating temperature from changes in sampled output signals at different times during the limited periods of time.

2. The method as defined by claim 1 wherein step b) includes applying bias voltage in response to a constant duty cycle pulse train.

3. The method as defined by claim 1 wherein step d) includes determining gain of the RF semiconductor device over said limited period of time.

4. Apparatus for determining the operating temperature of the active region of a semiconductor transistor device, the device including input terminal, output terminal, and bias terminal, the apparatus comprising:
   input means for providing an RF input signal to the input terminal of the device;
   output means for receiving an output signal from the output terminal of the device; and
   means, responsive to the input signal and the output signal, for determining RF gain of the active region of the device and for calculating operating temperature of the active region based on the determined RF gain.

5. The apparatus of claim 4 and further comprising: means for mounting the device.

6. The apparatus of claim 4 and further comprising: bias means for providing a bias voltage to the bias terminal of the device.

7. The apparatus of claim 4, wherein said output means includes a sample-and-hold means.

8. The apparatus as defined by claim 7 wherein said sample-and-hold means includes an input buffer, a sample-and-hold circuit, and an output buffer.

9. The apparatus as defined by claim 8 wherein said sample-and-hold means further includes chopper means interconnected between said sample-and-hold circuit and said output buffer.

10. The apparatus as defined by claim 4, wherein said means for determining further comprises:
    means for displaying the calculated operating temperature in a visible format.

11. Apparatus for determining operating temperature of an active region of a transistor device, the device including an input terminal, an output terminal and a bias terminal, the apparatus comprising:
    input means for providing an RF frequency input signal to the input terminal of the device;
    bias means for providing a bias voltage to the bias terminal during respective periodic time intervals;
    output means for holding respective samples of output signals received from the output terminal of the device in the course of the respective periodic time intervals; and
    means, responsive to the input signal and the output signal samples, for determining RF gain of the active region of the device and for calculating operating temperature of the active region based on the determined RF gain.

12. The apparatus of claim 4 wherein said output means includes an input buffer, a sample-and-hold circuit and an output buffer.

13. The apparatus of claim 12 wherein said sampling means further includes chopper means interconnected between said sample-and-hold circuit and said output buffer.

14. Apparatus for determining operating temperature of an active region of a transistor device, the device including an input terminal, an output terminal and a bias terminal, the apparatus comprising:
    input means for providing RF frequency input signals to the input terminal of the device;
    sampling means for holding samples of output signals received from the output terminal of the device;
    control means for controlling application of a bias voltage to the bias terminal of the device and for controlling the holding of samples of the output signals by said sampling means; and
    means, responsive to the input signals and to the output signals samples, for determining RF gain of the active region of the device and for calculating operating temperature in the active region based on the determined RF gain.

15. The apparatus of claim 14 wherein said control means includes:
    means for providing a sample command pulse train for application to said sampling means; and
    means for providing a bias pulse train for application to the bias terminal of the device.

16. The apparatus of claim 14 wherein said sampling means includes an input buffer, a sample-and-hold circuit, and an output buffer.

17. The apparatus of claim 16 wherein said sampling means further includes chopper means interconnected between said sample-and-hold circuit and said output buffer.

18. The apparatus of claim 14 wherein said control means includes a voltage-controlled oscillator for generating a pulsed signal, divider means for dividing said pulsed signal and providing a constant duty cycle pulse train a sample command pulse for application to said sampling means and a synchronized bias control pulse for application to the bias terminal.

19. A method for determining the operating temperature of an active region of a transistor device, the device including an input terminal, an output terminal, and a bias terminal, the method comprising the steps of:
    applying an RF signal to the input terminal of the device;
    detecting and holding respective output signal samples received from the output terminal of the device;
    determining RF gain of the active region of the device; and
    calculating operating temperature of the active region from the determined RF gain.

20. The method of claim 19 and further comprising the steps of:
    providing a bias voltage to the bias terminal during respective periodic time intervals.

21. The method of claim 19 and further comprising the steps of:
    providing a bias voltage to the bias terminal during respective periodic time intervals;
    providing respective sampling signals in the course of the respective periodic time intervals; and
    performing said step of detecting and holding in response to the sampling signals.

22. The method of claim 19, further comprising the step of:
    displaying calculated operating temperature in a visible format.

* * * * *